United States Patent [19]

Herd et al.

[11] Patent Number: 4,665,010
[45] Date of Patent: May 12, 1987

[54] METHOD OF FABRICATING PHOTOPOLYMER ISOLATION TRENCHES IN THE SURFACE OF A SEMICONDUCTOR WAFER

[75] Inventors: Harold H. Herd, Holmes; Lawrence Jacobowitz, Poughkeepsie, both of N.Y.; Jane M. Shaw, Ridgefield, Conn.

[73] Assignee: International Business Machines Corporation, Armonk, N.Y.

[21] Appl. No.: 728,633

[22] Filed: Apr. 29, 1985

[51] Int. Cl.[4] .......................... G03C 5/00; B05D 5/12
[52] U.S. Cl. ................................... 430/330; 430/296; 430/328; 430/967; 29/576 W; 427/93
[58] Field of Search ............... 430/270, 296, 283, 328, 430/330, 967; 427/93; 29/576 W; 427/93

[56] References Cited

U.S. PATENT DOCUMENTS

| | | | |
|---|---|---|---|
| 3,969,543 | 7/1976 | Roberts et al. | 427/54 |
| 4,016,017 | 4/1977 | Aboaf et al. | 148/187 |
| 4,041,190 | 8/1977 | Dubois et al. | 427/43 |
| 4,104,086 | 8/1978 | Bondur | 148/1.5 |
| 4,307,180 | 12/1981 | Pogge | 430/314 |
| 4,385,975 | 5/1983 | Chu et al. | 204/192 |
| 4,404,735 | 9/1983 | Sakurai | 29/576 |
| 4,404,736 | 9/1983 | Koshino et al. | 29/576 |
| 4,420,874 | 12/1983 | Funatsu | 29/576 |
| 4,427,713 | 1/1984 | White et al. | 427/54.1 |
| 4,576,834 | 3/1986 | Sobczck | 427/93 |

OTHER PUBLICATIONS

IBM Technical Disclosure Bulletin, vol. 27, No. 2, Jul. 1984, J. P. Kent Doublecoat Planar Polyimide Process.

Primary Examiner—John E. Kittle
Assistant Examiner—Patrick J. Ryan
Attorney, Agent, or Firm—John J. Goodwin

[57] ABSTRACT

A method for forming dielectric filled isolation trenches in a semiconductor substrate wherein the substrate is coated with a photopolymer layer which also fills the trenches. Depending on the type of radiation used, the photopolymer layer is masked except for the regions directly above the filled trenches. The structure is exposed to radiation through the mask, which is then removed. The unexposed portions of the photopolymer layer are washed away and heat is gradually applied to shrink the remaining photopolymer into the trenches until it becomes coplanar with the semiconductor substrate surface. A mask is used if the radiation is ultraviolet light, but no mask is required if electron beam or x-radiation is employed.

6 Claims, 5 Drawing Figures

METHOD OF FABRICATING PHOTOPOLYMER ISOLATION TRENCHES IN THE SURFACE OF A SEMICONDUCTOR WAFER

BACKGROUND OF THE INVENTION

1. Field of the Invention

The present invention relates to the formation of trenches in the surface of a semiconductor wafer which are filled with dielectric material for isolating regions of the semiconductor.

2. DESCRIPTION OF THE PRIOR ART

Known techniques for isolation trench filling in semiconductor technology includes the step of blanketing the entire chip area with the filling material and, hence, requires back-etching for removal of excess material outside of the trenches. Back-etching is time-consuming, expensive, and difficult to control.

Examples of prior art techniques are found in the following references.

U.S. Pat. No. 4,385,975, issued May 31, 1983 to Chu et al entitled METHOD OF FORMING WIDE, DEEP DIELECTRIC FILLED ISOLATION TRENCHES IN THE SURFACE OF A SILICON SEMICONDUCTOR SUBSTRATE describes a method of forming a wide deep dielectric filled isolation trench in the surface of a silicon semiconductor substrate by forming a wide plug of chemical vapor deposited silicon dioxide in the trench, filling the remaining unfilled trench portions by chemical vapor depositing a layer of silicon dioxide over the substrate and etching back this layer. The method produces chemically pure, planar wide deep dielectric filled isolation trenches and may also be used to simultaneously produce narrow deep dielectric filled isolation trenches.

U.S. Pat. No. 4,307,180 issued Dec. 22, 1981 to Pogge entitled PROCESS OF FORMING RECESSED DIELECTRIC REGIONS IN A MONOCRYSTALLINE SILICON SUBSTRATE describes a method of forming surface planarity to a substrate during removal of excess dielectric material when fabricating recessed regions of dielectric material in a semiconductor device wherein a dielectric layer is formed on the surface of the silicon substrate, a relatively thick layer of polycrystalline silicon deposited over the SiO$_2$ layer, openings formed through the polycrystalline layer and SiO$_2$ layer and into the substrate to form trenches, vapor depositing a layer of dielectric material over the surface of the substrate to a depth sufficient to fill the trench, depositing a planarized layer over a layer of dielectric material, reactive ion etching the planarizing layer, the dielectric layer, the polycrystalline layer, and selectively removing the remaining polycrystalline silicon layer to expose the SiO$_2$ layer.

U.S. Pat. No. 4,016,017 issued Apr. 5, 1977 to Aboaf et al entitled INTEGRATED CIRCUIT ISOLATION STRUCTURE AND METHOD FOR PRODUCING THE ISOLATION STRUCTURE describes a process for fabricating a semiconductor device having a pattern of oxidized and densified porous silicon regions extending onto one of its major surfaces for isolating regions of the semiconductor. The process involves forming porous silicon regions in the surface of the semiconductor body such as a silicon wafer, in the areas where dielectric isolation between semiconductor devices is desired. The porous silicon regions are then oxidized at a temperature sufficient to completely oxidize the porous silicon. The oxidation is such that the oxidized porous silicon extends above the surface of the semiconductor wafer. The oxidized porous silicon regions are then subjected to a temperature higher than the oxidizing temperature utilized in the previous step to cause the densification of the oxidized porous silicon regions. The result of this densification step is the collapse of the porous oxide to a dense structure which is substantially planar with the surface of the semiconductor wafer.

U.S. Pat. No. 4,104,086 issued Aug. 1, 1978 to Bondur et al entitled METHOD FOR FORMING ISOLATED REGIONS OF SILICON UTILIZING REACTIVE ION ETCHING describes a method for isolating regions of silicon involving the formation of openings that have a suitable taper in a block of silicon, thermally oxidizing the surfaces of the openings, and filling the openings with a dielectric material to isolate regions of silicon within the silicon block. The method is particularly useful wherein the openings are made through a region of silicon having a layer of a high doping conductivity.

U.S. Pat. No. 4,404,736 issued Sept. 20, 1983 to Koshino et al entitled METHOD FOR MANUFACTURING A SEMICONDUCTOR DEVICE OF MESA TYPE describes a method for manufacturing a semiconductor device of mesa type which comprises forming mesa recesses of predetermined depth around an element in the surface of a semiconductor body, forming on the back of semiconductor body a film for lessening the concentration of stress, filling glass powder into mesa recesses, and sintering glass powder to form glass insulators. According to the method of the present invention, cracks can be prevented from being caused in the semiconductor body and glass insulators formed in mesa recesses.

U.S. Pat. No. 4,404,735 issued Sept. 20, 1983 to Sakurai entitled METHOD FOR MANUFACTURING A FIELD ISOLATION STRUCTURE FOR A SEMICONDUCTOR DEVICE describes a method for forming a field isolation structure for semiconductor device, in which a groove is formed in a semiconductor substrate, an insulating layer is formed on the substrate at least in the groove, a glass layer or a silicon layer is formed thereon, and thereafter a high energy beam such as a laser beam is irradiated onto the glass or silicon layer to selectively heat the same thereby to melt or fluidify the layer and let the same flow into the groove is disclosed. A smooth and flat surface is obtained through the above melting process, which also prevents electrical breaks in wiring layers formed thereon. The method is particularly suited to producing small field isolation structures thus improving the integration density of the device.

U.S. Pat. No. 4,420,874 issued Dec. 20, 1983 to Funatsu entitled METHOD OF PRODUCING AN IIL SEMICONDUCTOR DEVICE UTILIZING SELF-ALIGNED THICKENED OXIDE PATTERNS describes a semiconductor device having an elementary region which is isolated by V-shape grooves from the other portions of the device, said semiconductor device comprising an insulating layer coating covering the surface of the semiconductor body of the device, wherein an injector region is formed under said insulating layer, and base regions are formed under said insulating layer between said thicker portions of said insulating layer and said V-shape grooves.

The prior art listed above is representative of the state of the art prior to the present invention and does not anticipate or make obvious the inventive features described hereinbelow.

SUMMARY OF THE INVENTION

An object of the present invention is to provide an improved method of forming isolation regions in a semiconductor wafer by dielectric-filled trenches.

Another object of the present invention is to provide an improved method of filling isolation trenches in a semiconductor wafer using photopolymer material, the excess portions of which are removed by washing.

A still further object of the present invention is to provide an improved method of filling isolation trenches in a semiconductor wafer using photopolymers which can be shrunk by ramped heat treatment.

The foregoing and other objects, features and advantages of the invention will be apparent from the following more particular description of the invention as illustrated in the accompanying drawings.

DESCRIPTION OF THE INVENTION

Figure 1:
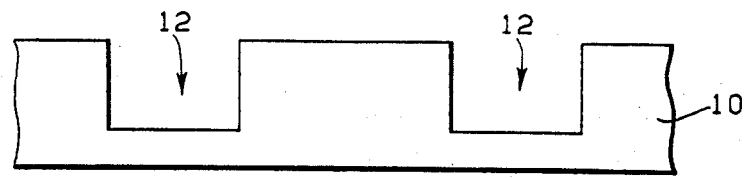
FIG. 1 through FIG. 5 are schematic illustrations of a cross section of a typical semiconductor wafer with trenches showing the steps in the process for filling the trenches with dielectric material.

Referring to FIG. 1, a schematic illustration of a semiconductor wafer 10 having trenches 12 formed therein in a manner well known in the prior art such as by a photolithographic masking technique.

Figure 2:
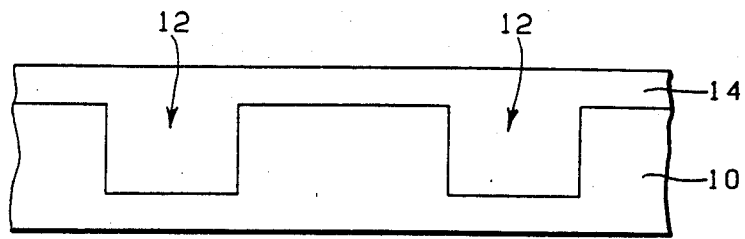

FIG. 2 shows the semiconductor wafer 10 coated with a photopolymer 14 which fills the trenches 12 as well as coats the surface of the wafer 10.

Figure 3:
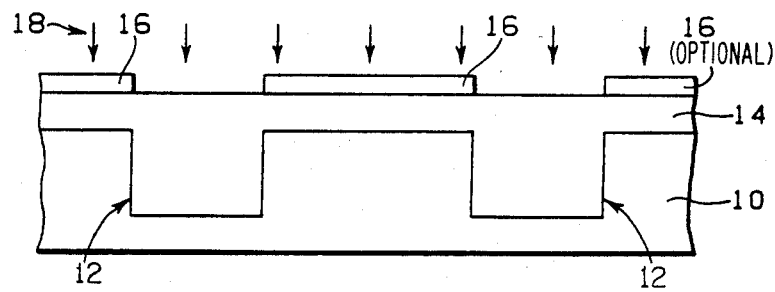

In FIG. 3, a mask 16 is provided which blocks the surface of the coated wafer except for the regions directly over the trenches 12. The mask 16 may preferably be the same mask used to delineate the trenches in the photolithographic process employed to produce the structure of FIG. 1. The mask 16 is only required when the exposing radiation is light. If the radiation is provided by an electron beam device or x-ray device, the electron or x-ray beam may be directed and confined onto the region above the photopolymer filled trench without the need for a mask.

The coated wafer structure 10 is then exposed to actinic radiation which may be ultraviolet light, electron beam radiation or x-rays. In the case of ultraviolet light, the light 18 is passed through the mask 16 as also illustrated in FIG. 3. The light 18 passes through mask 16 and exposes the portions of the photopolymer 14 above trenches 12.

Figure 4:
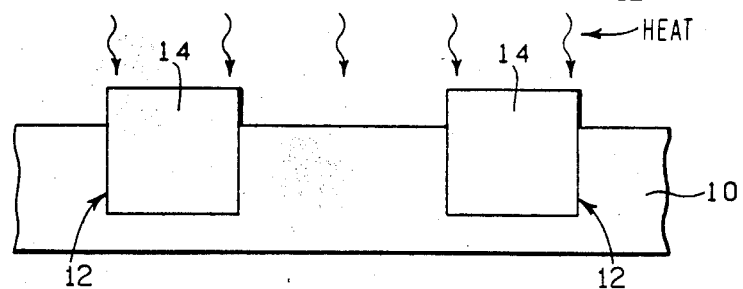

The mask 16 is then removed and the photopolymer layer 14 is washed, causing the unexposed portions to be removed and leaving crosslinked photopolymer 14 in the trenches 12, and in the region above the trenches 12 (overfill) by the thickness of the original photopolymer coating 14 on the surface of the wafer. The resultant structure is shown in FIG. 4.

Figure 5:
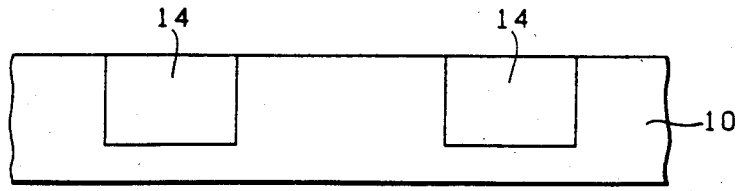

The wafer structure is next subjected to a rampled heat treatment which causes the remaining photopolymer 14 to shrink and recede into the trenches 12 until it is coplanar with the surface of wafer 10. This shrinking is possible because the photopolymer 14 has a composition which includes a solvent or compositional instability which makes such shrinkage practicable. Thus, the resultant structure illustrated in FIG. 5 is self-planarized.

The range of photopolymers which may be employed in the described process is large. The photofill does not depend on the particular type of polymer, however, there are several types which are preferred for their advantages. For example, polymide based resists are available and photopolymerizable siloxane-based compounds are available with high temperature and electrical properties similar to those of polymide which crosslink upon exposure to actinic radiation. One skilled in the art will be aware of known photopolymerizable siloxane based compounds in the literature. Such an organopolysiloxane photopolymer which exhibits crosslink upon exposure to actinic radiation is disclosed in U.S. Pat. No. 4,364,809 issued Dec. 21, 1982 to Sato et al. Another example is described in U.S. Pat. No. 4,064,027 issued Dec. 20, 1977 to Grant. Other examples and discussions of siloxane based photosensitive compounds are provided in the publications *Photocrosslinking of Polysiloxanes* by A. Schwartz et al in the Am. Chem. Soc. Div. Polym. Chem. Prep. Vol. 20 n 2 Sept. 1979 and *The Preparation and Properties of a Polysiloxane Electron Resist* by E. D. Roberts in J. Electrochem Soc.: SOLID STATE SCIENCE AND TECHNOLOGY, December 1973, pp. 1716–1721, Vol. 12. Also, photopolymers and photocross-linkable compounds based on silicic acid are useful for avoiding high temperature restrictions. Since silicic acid compounds can be formed with 70% to 80% silicon dioxide, shrinkage can be controlled as well as the avoidance of high temperature restrictions.

What has been described is a technique for filling isolation trenches in a semiconductor wafer with dielectric material which requires no back-etching and which can be shrunk back into the trenches by a controlled ramp heat application until the trench surface is coplanar with the wafer surface. Also, during fabrication, the unexposed or undesired dielectric material may be removed from the wafer surface by simple washing rather than etching.

Having thus described our invention, what we claim as new, and desire to secure by Letters Patent is:

1. A process for forming dielectric filled isolation trenches in the surface of a semiconductor substrate structure containing unfilled trenches comprising the steps of:
   coating said surface of said semiconductor substrate with photopolymer material such that said photopolymer coating material also fills said trenches,
   exposing said semiconductor structure with radiation to photo expose said photopolymer coated regions above said trenches and leaving the remainder of said photopolymer coating on said surface of said semiconductor substrate unexposed,
   washing away unexposed regions of said photopolymer coating leaving said exposed photopolymer regions above said trenches, and
   applying heat to said semiconductor substrate structure to cause said exposed photopolymer material on said trenches to shrink until said photopolymer material in said trenches is coplanar with said surface of said semiconductor substrate.

2. A method according to claim 1 wherein said photopolymer material is a photopolymerizable siloxane-based compound.

3. A method according to claim 1 wherein said photopolymer material is a silicic compound containing 70% to 80% silicon dioxide.

4. A method according to claim 1 wherein said radiation in said exposing step is electron beam radiation.

5. A method according to claim 1 wherein said radiation used in said exposing step is radiation in the x-ray frequency spectrum.

6. A method according to claim 1 further including, prior to said exposing step, the step of masking said coated semiconductor substrate surface with a light opaque mask having openings therein above said trench regions, and the step of removing said mask after said exposing step and washing away unexposed regions of said photopolymer coating, and wherein said radiation in said exposing step is ultraviolet radiation.

* * * * *